(12) United States Patent
Wan

(10) Patent No.: US 6,750,751 B2
(45) Date of Patent: Jun. 15, 2004

(54) INTEGRATED MAGNETIC SIGNAL ISOLATOR WITH FEEDBACK

(75) Inventor: Hong Wan, Maple Grove, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/211,906

(22) Filed: Aug. 1, 2002

(65) Prior Publication Data
US 2004/0021544 A1 Feb. 5, 2004

(51) Int. Cl.[7] .................................................. H01F 5/00
(52) U.S. Cl. ........................ 336/200; 324/114; 324/249; 324/252
(58) Field of Search ........................... 336/200; 307/91; 324/117, 252, 249

(56) References Cited

U.S. PATENT DOCUMENTS

| | | |
|---|---|---|
| 4,596,950 A | 6/1986 | Lienhard et al. |
| 4,849,695 A | 7/1989 | Muller et al. |
| 5,351,005 A | 9/1994 | Rouse et al. |
| 5,952,825 A | 9/1999 | Wan |
| 6,054,780 A | 4/2000 | Haigh et al. |
| 6,376,933 B1 * | 4/2002 | Goetz et al. .................. 307/91 |
| 6,583,629 B1 * | 6/2003 | Stokes et al. ............... 324/632 |

OTHER PUBLICATIONS

Myers et al. "GMR Isolators", Nonvolatile Electronics, Inc., Copyright 1998, 7 pgs.
Hermann et al., "Magnetically Coupled Linear Isolator", Magnetics Conference, 1997, p. ES–11.

* cited by examiner

*Primary Examiner*—Lincoln Donovan
*Assistant Examiner*—Jennifer A. Poker
(74) *Attorney, Agent, or Firm*—Schiff Hardin LLP

(57) ABSTRACT

An integrated circuit signal isolator includes a magnetic field sensor in a first metal layer formed over a semiconductor substrate. A first dielectric layer is formed over the first metal layer, and an input coil in a second metal layer is formed over the first dielectric layer. Additionally, a second dielectric layer is formed over the second metal layer, and a feedback coil in a third metal layer is formed over the second dielectric layer. The feedback coil is coupled to an output of the magnetic field sensor.

29 Claims, 3 Drawing Sheets

INTEGRATED MAGNETIC SIGNAL ISOLATOR WITH FEEDBACK

TECHNICAL FIELD OF THE INVENTION

The present invention relates to integrated signal isolators. In particular, the present invention relates to integrated magnetically coupled, single-chip, signal isolators with feedback.

BACKGROUND OF THE INVENTION

It is known to use extremely small integrated magnetic field sensing devices to sense magnetic fields. Such devices can be made by using a plurality of thin strips or elements of a magnetoresistive film comprising a magnetically responsive material, such as Permalloy®. Magnetization of the film generally forms an angle with the direction of current flow, and the resistance of the film depends on this angle. For example, when magnetization of the film is parallel to the direction of current flow, the resistance of the film is at a maximum. On the other hand, when magnetization is perpendicular to the direction of current flow, the resistance of the film is at a minimum. This phenomena is called Anisotripic magneto-resistive or AMR.

The magnetoresistive strips or elements may be formed into four separate legs of a Wheatstone Bridge. The legs are then oriented to be sensitive to a field perpendicular to the initial magnetization direction. Bridge configurations that conserve space include arrangements in which the four elements are provided in a single plane, in single columns or rows, or as two side-by-side sets of two elements each.

A magnetic field sensor also can be made of a Giant Magneto-resistive (GMR) thin film. A GMR film consists of multiple layers of ferromagnetic film that are separated by Noble metal or insulating compound films. The resistance of the GMR film depends on the relative magnetization angle between adjacent ferromagnetic layers.

A magnetic field sensor incorporating such magnetoresistive elements is sometimes formed on a semiconductor substrate using integrated circuit techniques, and the substrate is provided with an insulating layer, typically silicon dioxide and/or silicon nitride.

It is also known to use signal isolators to isolate input and output signals with a potential difference between their respective grounds. These signal isolators have been used in various fields, for example, in industry controls, in order to eliminate transient currents for safety purposes. Also, these signal isolators have been used in communication networks to provide high speed signal transmission with less noise.

A magnetic signal isolator usually includes a magnetic field sensor, such as one or more of the magnetoresistors, and an input coil. The input coil is coupled to the input of the magnetic isolator in order to generate a magnetic field in response to an input signal. The magnetic field sensor senses this magnetic field and produces a corresponding output signal. Accordingly, the input coil receives an input signal from a first circuit operating at a first voltage level, and the magnetic field sensor responds to the magnetic field by producing an output signal in a second circuit operating at a second voltage level, which may be either lower or higher than the first voltage level, and which may have an ground reference voltage isolated from the inputs.

However, typical magnetic sensors have limited signal ranges and linearities that can limit performance, especially in the case of linear magnetic signal isolators.

The present invention offers an integrated magnetically coupled signal isolator that effectively uses closed-loop feedback architecture to improve isolator linearity, signal range, and immunity to uniform external magnetic fields in any direction.

SUMMARY OF THE INVENTION

In accordance with one aspect of the present invention, an integrated circuit signal isolator having a plurality of layers formed over a substrate comprises a magnetic field sensor, an input coil, feedback coil, and dielectric layers. The magnetic field sensor is formed in a first of the plurality of layers, the input coil is formed in a second of the plurality of layers, and the feedback coil is formed in a third of the plurality of layers. The feedback coil is coupled to an output of the magnetic field sensor. The dielectric layers separate the magnetic field sensor, the input coil, and the feedback coil.

In accordance with another aspect of the present invention, an integrated circuit signal isolator comprises a semiconductor substrate, a sensor metal layer, an input coil metal layer, a feedback coil metal layer, and dielectric layers. The sensor metal layer contains a magnetic field sensor that provides an output signal corresponding to an input signal of the integrated circuit signal isolator. The input coil metal layer contains an input coil that receives the input signal of the integrated circuit signal isolator. The feedback coil metal layer contains a feedback coil, and the feedback coil is coupled so as to receive a signal based on the output signal from the magnetic field sensor. The dielectric layers separate the sensor metal layer, the input coil metal layer, and the feedback coil metal layer.

In accordance with a further aspect of the present invention, a method for providing closed loop linear signal isolation comprises the following: converting an input signal to a first magnetic field by use of a first coil integrated on a single chip; converting the first magnetic field to a sensor electrical output signal by use of a magnetic field sensor integrated on the single chip; and, converting the sensor electrical output signal to a second magnetic field by use of a second coil integrated on the single chip, wherein the second magnetic field is arranged to cancel the first magnetic field.

BRIEF DESCRIPTION OF THE DRAWINGS

These and other features and advantages will become more apparent from a detailed consideration of the present invention when taken in conjunction with the drawings in which.

DETAILED DESCRIPTION

Figure 1:
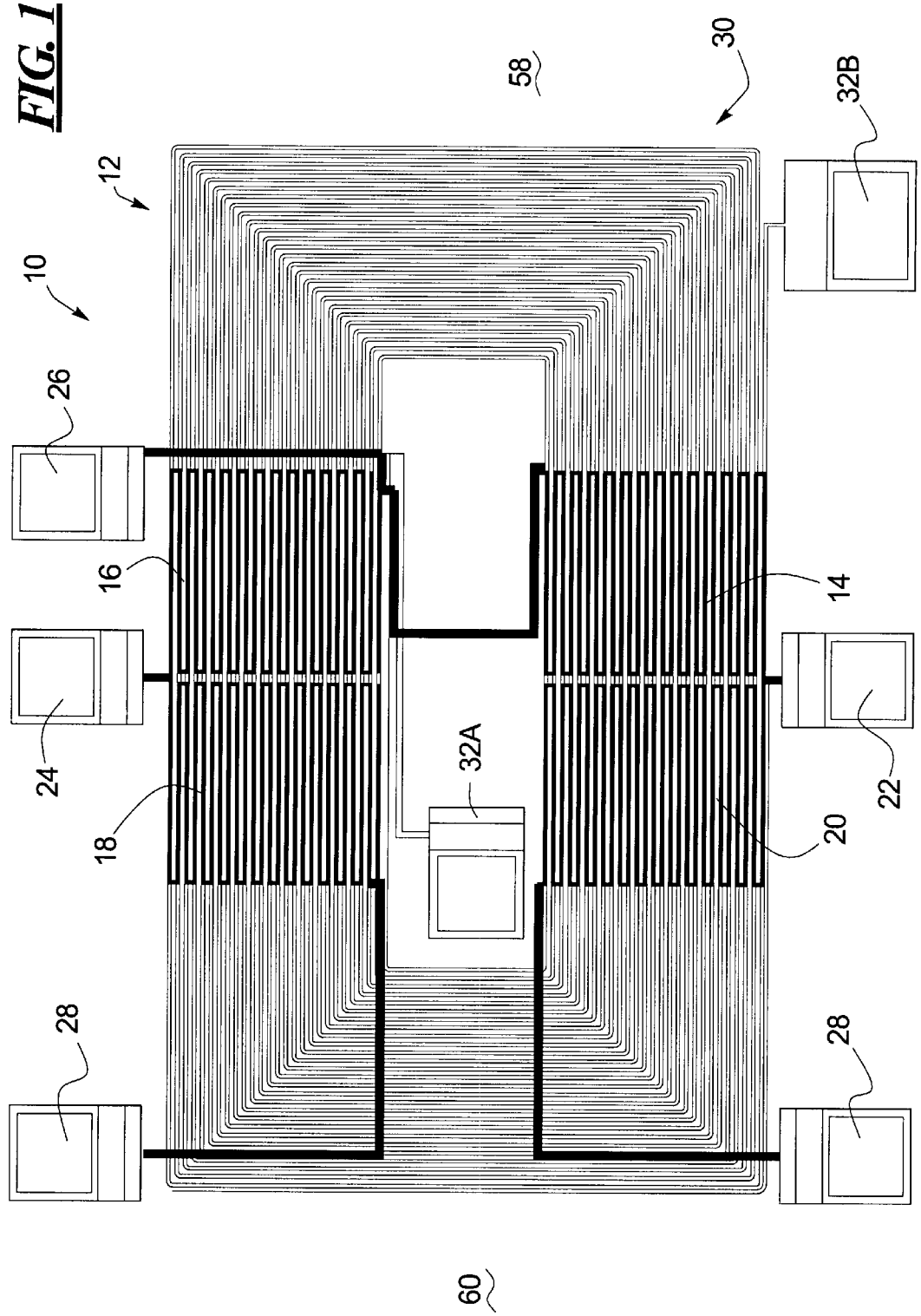
FIG. 1 illustrates an integrated magnetic signal isolator in accordance with an exemplary aspect of the present invention.
Figure 2:
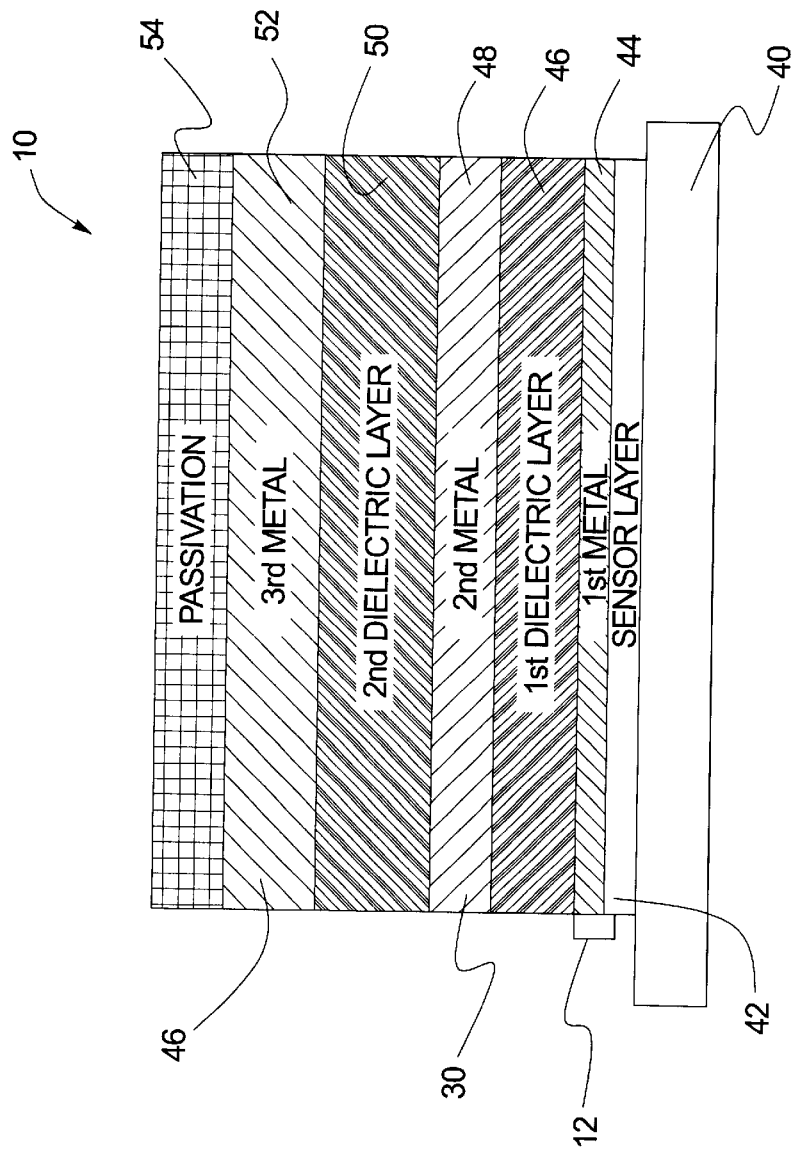
FIG. 2 illustrates a cross section of an integrated magnetic signal isolator in accordance with the exemplary aspect of the present invention; and, FIG. 3 illustrates a schematic diagram of an integrated magnetic signal isolator in accordance with the exemplary aspect of the present invention.
Figure 3:
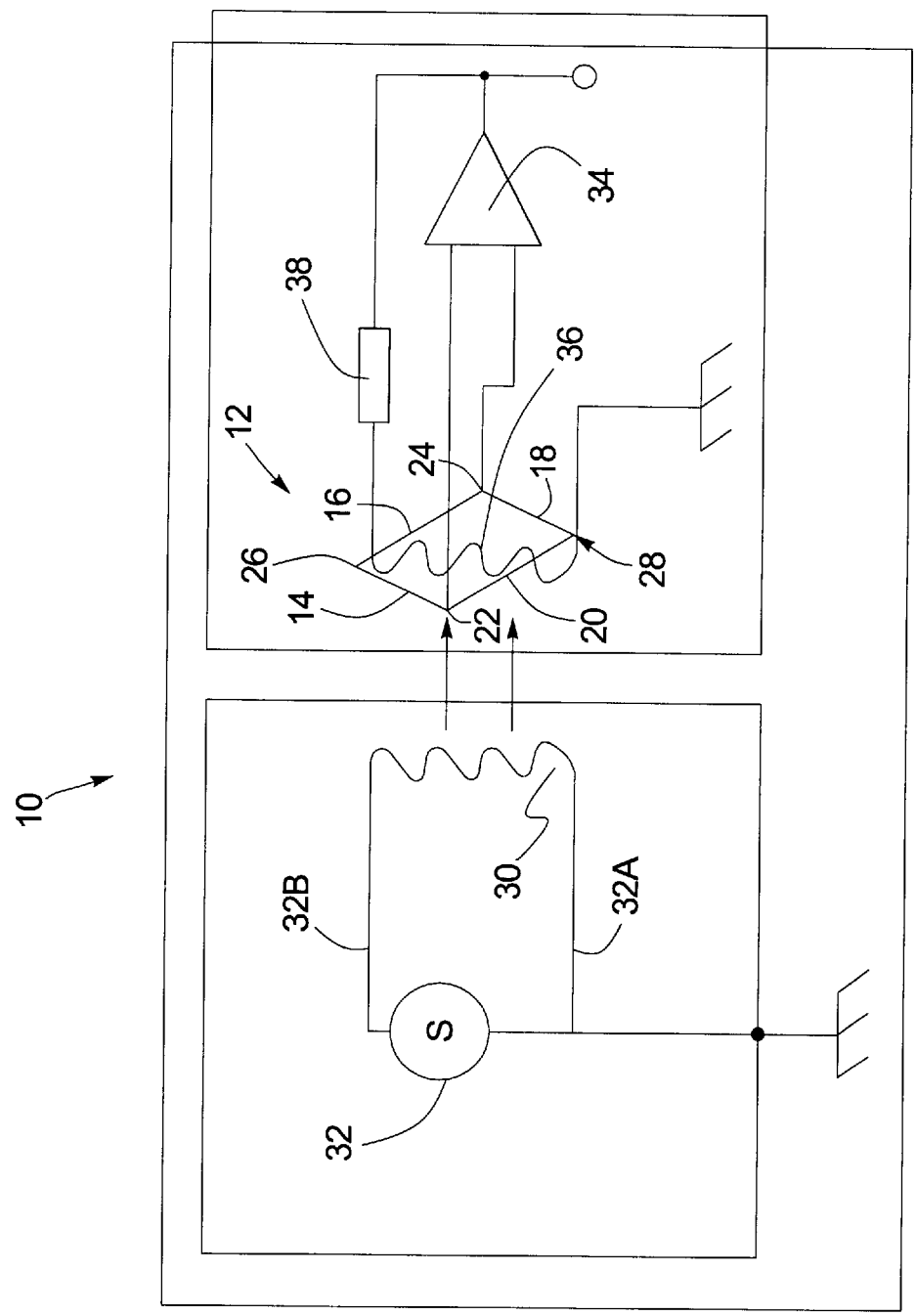

FIGS. 1–3 illustrate an integrated magnetic signal isolator 10 in accordance with an exemplary aspect of one embodiment of the present invention. The integrated magnetic signal isolator 10 includes a magnetic field sensor 12 having magnetoresistors 14, 16, 18, and 20. Each of the magnetoresistors 14, 16, 18, and 20 may comprise, for example, a thin film of a magnetically responsive material, such as NiFe, which is often sold under the brand name of Permalloy®, or GMR multilayer films, such as CoFe/Cu/ CoFe/Cu . . . , or Spin valve, Spin dependent tunnel films. Each of the magnetoresistors 14, 16, 18, and 20 may be provided, for example, as a plurality of thin strips of the magnetically responsive material, and the strips of each of the magnetoresistors 14, 16, 18, 20 may be coupled end-to-end to form a corresponding serpentine magnetoresistor structure.

As shown in FIGS. 1 and 3, the magnetoresistors 14, 16, 18, and 20 of the magnetic field sensor 12 may be electrically arranged to form a Wheatstone Bridge having a first junction 22 between the magnetoresistors 14 and 20, a second junction 24 between the magnetoresistors 16 and 18, a third junction 26 between the magnetoresistors 14 and 16, and a fourth junction 28 between the magnetoresistors 18 and 20. The first and second junctions 22 and 24 provide an output signal of the magnetic field sensor 12, and the third and fourth junctions 26 and 28 are coupled to a bridge supply.

An input coil 30 is coupled across terminals 32A and 32B of an input current source 32. The current source 32 is labeled S in FIG. 3. The magnetoresistors 14 and 20 are aligned along a first axis that is parallel to a first elongated portion of each of the turns of the input coil 30, and the magnetoresistors 16, 18 are aligned along a second axis that is parallel to a second elongated portion of each of the turns of the input coil 30. These first and second axes are parallel to and offset from one another. Alternatively, the magnetoresistors 14 and 16 can be on one portion of the turns, and the magnetoresistors 18 and 20 can be on the other portion of the turns.

The input coil 30 generates a magnetic field for the magnetic field sensor 12 in response to an input signal from the input current source 32. The input current source 32 may have a different ground potential that the sensor 12 and the output signal across the terminals 22 and 24. The magnetic field sensor 12 delivers an output signal to an amplifier 34 coupled to a feedback coil 36 through a feedback resistor 38. The current in the feedback loop formed by the feedback coil 36 and the feedback resistor 38 or the voltage across the feedback resistor 36 can provide a corresponding output current or voltage signal.

As shown in FIG. 2, the integrated magnetic signal isolator 10 includes a semiconductor substrate 40 over which is formed the magnetic field sensor 12 in the form of the magnetoresistors 14, 16, 18, and 20, which may be provided in a plurality of AMR or GMR films. The magnetic field sensor 12 is formed in a layer 42. A first metal layer 44 is provided over the layer 42. The first metal layer 44 can be used to form a Barberpole structure on the layer 42 for AMR films, and to provide electric connections for the layer 42. A first dielectric layer 46 is formed over the first metal layer 44.

The input coil 30 comprises a plurality of turns of metal (see FIG. 1) in a second metal layer 48 formed over the first dielectric layer 46. The elongated portions of the turns of the input coil 30 may be arranged to run parallel to the thin film strips of the magnetoresistors 14, 16, 18, and 20 as discussed above. A second dielectric layer 50 is formed over the input coil 30 in the second metal layer 48. Each of the first and second dielectric layers 40 and 44 may comprise, for example, silicon dioxide or silicon nitride.

The feedback coil 36 (which will be discussed with reference to FIG. 3) is provided in a third metal layer 52 over the second dielectric layer 50, and a passivation layer 54 may be provided over the third metal layer 52. Although not shown in FIG. 1, the feedback coil 36 is above the input coil 30 and may generally have substantially the same configuration as the input coil 30. However, the feedback coil 36 may have a different configuration from the input coil 30, but the feedback coil 36 should preferably be in a plane that is parallel to the plane of the input coil 30. The strip width of the feedback coil 36 and the input coil 30 can be varied as long as both cover the sensor bridge.

Accordingly, the magnetic field sensor 12 is integrated on a single chip with the input coil 30 and the feedback coil 36 to form the integrated magnetic signal isolator 10.

In the arrangement shown in FIG. 1, an input signal from the input current source 32 is applied to the input coil 30 through the terminals 32A and 32B. This input current flows through the input coil 30 along the magnetoresistors 14 and 20 from a first end 58 to a second end 60 of the integrated magnetic signal isolator 10, depending on the polarity of the input signal. In addition, this input current flows through the input coil 30 along the magnetoresistors 18 and 16 from the second end 60 to the first end 58 of the integrated magnetic signal isolator 10, again depending on the polarity of the input signal.

FIG. 3 illustrates a schematic diagram of a closed-loop feedback configuration circuit according to an exemplary aspect of the present invention. As shown in FIG. 3, an input signal is supplied to the input coil 30 to generate an input magnetic field that is proportional to the input signal. The magnetic field sensor 12 converts the input magnetic field into a voltage output, which is supplied through the amplifier 34 and the feedback resistor 38 to one side of the feedback coil 36, the other side of which may be coupled to ground. This feedback voltage provided by the amplifier 34 and the feedback resistor 38 to the feedback coil 36 causes the feedback coil 36 to generate a feedback magnetic field that cancels the input magnetic field generated by the input coil 30. Thus, at equilibrium, the magnetoresistors 14, 16, 18, 20 are operated in a zero magnetic field.

The voltage across the feedback resistor 38 is proportional to the input current received by the input coil 30.

By using this closed-loop technique, the input and output can track each other while remaining galvanically isolated. Also, this closed-loop technique improves both the linearity and linear range of the magnetic isolator. Because the magnetic sensor is always operated at its zero point, the limitations of the magnetic sensor, in terms of linearity and linear range, have been eliminated. Furthermore, the integrated magnetic signal isolator 10 produces an output that is substantially immune from any uniform external magnetic field in any direction. That is, with the integrated magnetic signal isolator 10 shown in FIGS. 1 and 3, a uniform external magnetic field of any direction does not contribute to the output differential across the first and second junctions 22 and 24 because the voltages across the magnetoresistors 14 and 16 produced by the external magnetic field track one another as do the voltages across the magnetoresistors 20 and 18. Therefore, any change in the external magnetic field produces voltage changes at the first and second junctions 22 and 24 that are equal in magnitude and sign.

However, when an input current signal is applied to the input coil 30, an input magnetic field across the magnetoresistors 14 and 20 is generated that is opposite in direction to the input magnetic field generated across the magnetoresistors 16 and 18. These oppositely oriented magnetic fields produce a differential output across the first and second junctions 22 and 24.

An exemplary method of manufacturing the integrated magnetic signal isolator 10 of the present invention comprises, for example, the steps of fabricating the magnetic field sensor 12, the input coil 30, and the feedback coil 36 on the silicon substrate 40 using conventional semiconductor processes.

Modifications of the present invention will occur to those practicing in the art of the present invention. For example, the relative locations of the layers containing the magnetoresistors 14, 16, 18, 20, the input coil 30, and the feedback coil 36 may be varied provided attention is given to the magnetic fields sensed by the magnetoresistors 14, 16, 18, 20.

Moreover, while the present invention has been described in terms of a four leg Wheatstone Bridge arrangement, it is to be understood that a two-element bridge may be used instead. An input or a feedback coil in a different format may be provided as long as the input and feedback coils provide fields in the same direction for the sensor. Alternatively, the input and feedback coils could be on the top and underneath of the sensor elements, respectively.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. An integrated circuit signal isolator having a plurality of layers formed over a substrate comprising:
    a magnetic field sensor formed in a first of the plurality of layers;
    an input coil formed in a second of the plurality of layers;
    a feedback coil formed in a third of the plurality of layers, wherein the feedback coil is coupled to an output of the magnetic field sensor;
    dielectric layers separating the magnetic field sensor, the input coil, and the feedback coil; and,
    a barberpole layer formed as a fourth of the plurality of layers.

2. The integrated circuit signal isolator of claim 1 wherein the magnetic field sensor comprises an iron-nickel alloy.

3. The integrated circuit signal isolator of claim 1 wherein the magnetic field sensor comprises a Giant Magneto-Resistive multilayer film.

4. The integrated circuit signal isolator of claim 1 further comprising an amplifier having an input coupled to the output of the magnetic field sensor and an output coupled to the feedback coil.

5. The integrated circuit signal isolator of claim 4 further comprising a resistor coupled between the output of the amplifier and the feedback coil.

6. The integrated circuit signal isolator of claim 1 wherein the magnetic field sensor comprises at least first and second magnetoresistors coupled in series to a supply and having a junction coupled to the feedback coil.

7. The integrated circuit signal isolator of claim 6 further comprising an amplifier having an input coupled to the junction and an output coupled to the feedback coil.

8. The integrated circuit signal isolator of claim 7 further comprising a resistor coupled between the output of the amplifier and the feedback coil.

9. The integrated circuit signal isolator of claim 1 wherein the magnetic field sensor comprises first, second, third, and fourth magnetoresistors, wherein the first and second magnetoresistors are coupled in series to a supply, wherein the third and fourth magnetoresistors are coupled in series to the supply, wherein the first and second magnetoresistors form a first junction, wherein the third and fourth magnetoresistors form a second junction, and wherein the first and second junctions are coupled to the feedback coil.

10. The integrated circuit signal isolator of claim 9 further comprising an amplifier having an input coupled to the first and second junctions and an output coupled to the feedback coil.

11. The integrated circuit signal isolator of claim 10 further comprising a resistor coupled between the output of the amplifier and the feedback coil.

12. An integrated circuit signal isolator comprising:
    a semiconductor substrate;
    a sensor metal layer containing a magnetic field sensor that provides an output signal corresponding to an input signal of the integrated circuit signal isolator, wherein the magnetic field sensor comprises first and second magnetoresistors;
    an input coil metal layer containing an input coil that receives the input signal of the integrated circuit signal isolator, wherein the input coil is disposed relative to the first and second magnetoresistors so that the input signal produces oppositely directed magnetic fields across the first and second magnetoresistors;
    a feedback coil metal layer containing a feedback coil, wherein the feedback coil is coupled so as to receive a signal based on the output signal from the magnetic field sensor; and,
    dielectric layers separating the sensor metal layer, the input coil metal layer, and the feedback coil metal layer.

13. The integrated circuit signal isolator of claim 12 wherein the magnetic field sensor comprises an iron-nickel alloy.

14. The integrated circuit signal isolator of claim 12 wherein the magnetic field sensor comprises a Giant Magneto-Resistive multilayer film.

15. The integrated circuit signal isolator of claim 12 further comprising an amplifier having an input coupled to an output of the magnetic field sensor and an output coupled to the feedback coil.

16. The integrated circuit signal isolator of claim 15 further comprising a resistor coupled between the output of the amplifier and the feedback coil.

17. The integrated circuit signal isolator of claim 12 wherein the first and second magnetoresistors are coupled in series to a supply and form a junction coupled to the feedback coil.

18. The integrated circuit signal isolator of claim 17 further comprising an amplifier having an input coupled to the junction and an output coupled to the feedback coil.

19. The integrated circuit signal isolator of claim 18 further comprising a resistor coupled between the output of the amplifier and the feedback coil.

20. The integrated circuit signal isolator of claim 12 wherein the magnetic field sensor further comprises third and fourth magnetoresistors, wherein the first and third magnetoresistors are coupled in series to a supply, wherein the second and fourth magnetoresistors are coupled in series to the supply, wherein the first and third magnetoresistors form a first junction, wherein the second and fourth magnetoresistors form a second junction, and wherein the first and second junctions are coupled to the feedback coil.

21. The integrated circuit signal isolator of claim 20 further comprising an amplifier having an input coupled to the first and second junctions and an output coupled to the feedback coil.

22. The integrated circuit signal isolator of claim 21 further comprising a resistor coupled between the output of the amplifier and the feedback coil.

23. A method for providing closed loop linear signal isolation comprising:

converting an input signal to first and second oppositely directed magnetic fields by use of a first coil integrated on a single chip;

converting the first and second oppositely directed magnetic fields to a sensor electrical output signal by use of a magnetic field sensor integrated on the single chip, the magnetic field sensor having a first magnetoresistor responsive to the first magnetic field, a second magnetoresistor responsive to the second magnetic field, and a barberpole layer; and, converting the sensor electrical output signal to a third magnetic field by use of a second coil integrated on the single chip, wherein the third magnetic field is arranged to cancel the first and second magnetic fields.

24. The method of claim 23 wherein the magnetic field sensor comprises an iron-nickel alloy.

25. The method of claim 23 wherein the converting of the sensor electrical output signal to a third magnetic field comprises:

amplifying the sensor electrical output signal; and, converting the amplified sensor electrical output signal to the third magnetic field.

26. The method of claim 23 wherein the first and second magnetoresistors are coupled in series to a supply and form a junction supplying the sensor electrical output signal.

27. The method of claim 26 wherein the converting of the sensor electrical output signal to a third magnetic field comprises:

amplifying the sensor electrical output signal at the junction; and, converting the amplified sensor electrical output signal to the third magnetic field.

28. The method of claim 23 wherein the magnetic field sensor further comprises third and fourth magnetoresistors, wherein the first and third magnetoresistors are coupled in series to a supply, wherein the second and fourth magnetoresistors are coupled in series to the supply, wherein the first and third magnetoresistors form a first junction, wherein the second and fourth magnetoresistors form a second junction, and wherein the first and second junctions are coupled to the feedback coil.

29. The method of claim 28 wherein the converting of the sensor electrical output signal to a third magnetic field comprises:

amplifying the sensor electrical output signal at the first and second junctions; and, converting the amplified sensor electrical output signal to the third magnetic field.

* * * * *